(12) United States Patent
Scheuerlein

(10) Patent No.: US 7,317,641 B2
(45) Date of Patent: Jan. 8, 2008

(54) VOLATILE MEMORY CELL TWO-PASS WRITING METHOD

(75) Inventor: Roy E. Scheuerlein, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 157 days.

(21) Appl. No.: 11/157,317

(22) Filed: Jun. 20, 2005

(65) Prior Publication Data

US 2006/0285423 A1 Dec. 21, 2006

(51) Int. Cl.
*G11C 7/00* (2006.01)

(52) U.S. Cl. .............................. 365/189.01; 365/185.18

(58) Field of Classification Search ........... 365/189.01, 365/185.18, 175
See application file for complete search history.

(56) References Cited

U.S. PATENT DOCUMENTS

| | | | |
|---|---|---|---|
| 4,574,365 A | 3/1986 | Scheuerlein | 365/149 |
| 5,268,870 A | 12/1993 | Harari | 365/218 |
| 5,474,365 A | 12/1995 | Von Linsingen-Heintzmann | 299/33 |
| 5,915,167 A | 6/1999 | Leedy | 438/108 |
| 6,034,882 A | 3/2000 | Johnson et al. | 365/103 |
| 6,185,122 B1 | 2/2001 | Johnson et al. | 365/103 |
| 6,490,218 B1 | 12/2002 | Vyvoda et al. | 365/225.7 |
| 6,504,753 B1 | 1/2003 | Scheuerlein et al. | 365/175 |
| 6,522,594 B1 | 2/2003 | Scheuerlein | 365/206 |
| 6,559,491 B2 * | 5/2003 | Forbes et al. | 257/296 |
| 6,618,295 B2 | 9/2003 | Scheuerlein | 365/189.09 |
| 6,631,085 B2 | 10/2003 | Kleveland et al. | 365/175 |
| 6,633,509 B2 | 10/2003 | Scheuerlein et al. | 365/230.03 |
| 6,661,730 B1 | 12/2003 | Scheuerlein et al. | 365/230.03 |
| 6,686,624 B2 | 2/2004 | Hsu | 257/315 |
| 6,735,104 B2 | 5/2004 | Scheuerlein | 365/51 |
| 6,754,102 B2 | 6/2004 | Kleveland et al. | 365/185.03 |
| 6,768,685 B1 | 7/2004 | Scheuerlein | 365/189.07 |
| 6,816,410 B2 | 11/2004 | Kleveland et al. | 365/185.03 |
| 6,822,903 B2 | 11/2004 | Scheuerlein et al. | 365/185.18 |
| 6,856,572 B2 | 2/2005 | Scheuerlein et al. | 365/230.06 |
| 6,859,410 B2 | 2/2005 | Scheuerlein et al. | 365/230.06 |

(Continued)

FOREIGN PATENT DOCUMENTS

| | | |
|---|---|---|
| WO | WO 2004/061861 | 7/2004 |
| WO | WO 2004/061863 | 7/2004 |
| WO | WO 2004/090905 | 10/2004 |

OTHER PUBLICATIONS

Ohsawa et al. "An 18.5ns 128 Mb SOI DRAM with a Floating Body Cell" Solid-State Circuits Conference, 2005. Digest of Technical Papers. ISSCC. 2005 IEEE International, Volume Feb. 9, 2005 pp. 458-695.

(Continued)

*Primary Examiner*—Vu A. Le

(57) ABSTRACT

A method is set forth for writing volatile memory cells embodied on an integrated circuit and taking the form of an array of volatile memory cells including a plurality of word lines and a plurality of bit lines. In use, a first write operation is performed on at least one memory cell at a first time. Further, at a second time, a second write operation is performed on at least one memory cell. During use, various voltage relationships may be employed for enhanced programming. Just by way of example, a voltage at a corresponding word line associated with the at least one memory cell during the first write operation is different than that during the second write operation.

58 Claims, 15 Drawing Sheets

U.S. PATENT DOCUMENTS

| | | | |
|---|---|---|---|
| 7,221,588 B2* | 5/2007 | Fasoli et al. | 365/185.17 |
| 2002/0028541 A1 | 3/2002 | Lee et al. | 438/149 |
| 2002/0105057 A1 | 8/2002 | Vyvoda et al. | 257/618 |
| 2003/0081489 A1 | 5/2003 | Scheuerlein et al. | 365/225.7 |
| 2004/0007721 A1 | 1/2004 | Forbes et al. | 257/204 |
| 2004/0100831 A1 | 5/2004 | Knall et al. | 365/200 |
| 2004/0124415 A1 | 7/2004 | Walker et al. | 257/65 |
| 2004/0155317 A1 | 8/2004 | Bhattacharyya | 257/616 |
| 2004/0188714 A1 | 9/2004 | Scheuerlein et al. | 257/200 |
| 2004/0263238 A1 | 12/2004 | Thorp et al. | 327/536 |
| 2005/0047240 A1 | 3/2005 | Ikehashi et al. | 365/222 |
| 2005/0078537 A1 | 4/2005 | So et al. | 365/211 |

OTHER PUBLICATIONS

Ohsawa et al. "Memory design using one-transistor gain cell on SOI" Solid-State Circuits Conference, 2002. Digest of Technical Papers. ISSCC. 2002 IEEE International, vol. 1, Feb. 3-7, 2002 pp. 152-455 vol. 1.

Ohsaki et al. "A Single Poly EEPROM Cell Structure for Use in Standard CMOS Processes" IEEE Journal of Solid-State Circuits, vol. 29, No. 3, Mar. 1994.

Co-pending application filed coincidently herewith, naming common inventorship, and entitled "Floating Body Memory Cell System and Method of Manufacture."

* cited by examiner

VOLATILE MEMORY CELL TWO-PASS WRITING METHOD

BACKGROUND AND FIELD OF THE INVENTION

The present invention relates to memory devices, and more particularly to programming memory devices.

SUMMARY

A method is set forth for writing volatile memory embodied on an integrated circuit and taking the form of an array of memory cells including a plurality of word lines and a plurality of bit lines. In use, a first write operation is performed on at least one memory cell (e.g. a selected memory cell) at a first time. Further, at a second time, a second write operation is performed on at least one memory cell. During use, a voltage at a corresponding word line associated with the at least one memory cell during the first write operation is different than that during the second write operation.

In other embodiments, a voltage at a corresponding word line associated with at least one unselected memory cell during the first write operation is different than that during the second write operation. In still another embodiment, a voltage at a corresponding bit line common associated with at least one unselected memory cell during the first write operation is different than that during the second write operation.

In still other embodiments, another method is provided for writing memory. In use, a write off operation is performed on at least one memory cell by applying a first voltage to a corresponding bit line associated with the at least one memory cell. Further, a second voltage is applied to a corresponding word line associated with at least one other memory cell which is in communication with the corresponding bit line. During use, such first voltage and second voltage are negative voltages. Still yet, a magnitude of the second voltage is greater than a magnitude of the first voltage.

DETAILED DESCRIPTION

Figure 1:
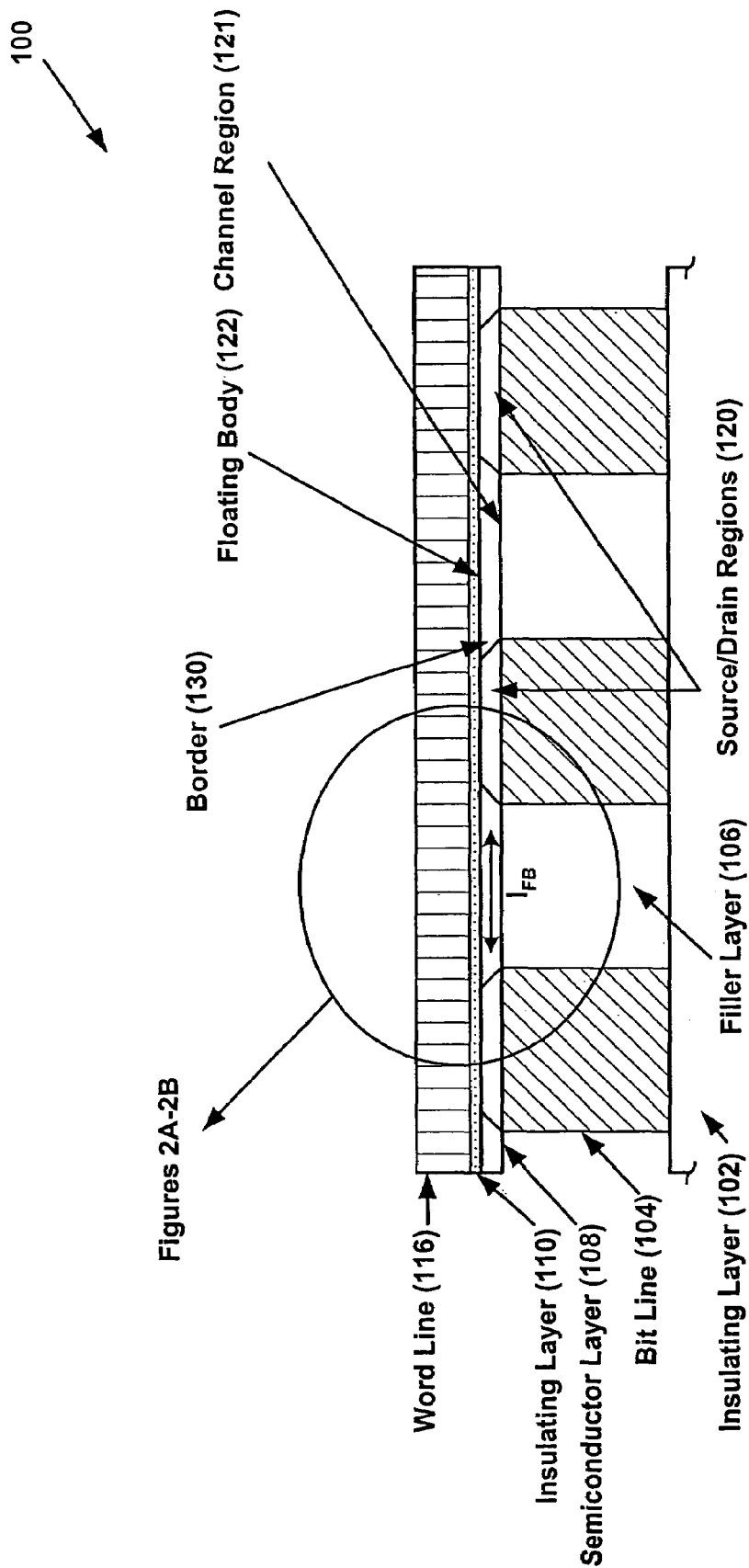
FIG. 1 is a cross-sectional view showing a portion of an array of memory cells, according to one embodiment.

FIG. 1 is a cross-sectional view showing a portion of an array of memory cells 100, according to one embodiment. While only a portion of such array of memory cells 100 is shown, it should be understood that a multiplicity of memory cells 100 may span in two directions. Further, while only one level of memory cells 100 is described, it should further be noted that, in some optional embodiments, a plurality of levels of the memory cells 100 may be vertically disposed to form a three-dimensional array of memory cells 100. Of course, the various features set forth herein are further contemplated for a two-dimensional array of memory cells 100.

As shown, the array of memory cells 100 may be formed over a planarized insulating layer 102. While the planarized insulating layer 102 may take any desired form, it may, in one possible embodiment, be a chemical-mechanical polished (CMP) planarized silicon oxide layer. Insulating layer 102 may further be formed above a substrate (not shown), as in the aforementioned three-dimensional array embodiment. While the substrate may be constructed from any desired material, it may, in one embodiment, include monocrystalline silicon. While the array of memory cells 100 are shown to be formed over a planarized insulating layer 102, it should be noted that such array of memory cells 100 may also be formed in the abovementioned unillustrated substrate.

Positioned above the insulating layer 102 is a plurality of bit lines 104 which, at least in part, extend along a first direction. Disposed between the bit lines 104 is an insulating filler layer 106, such as silicon oxide or any other desired material. The bit lines 104 may be manufactured utilizing any desired material such as polysilicon (e.g. heavily doped polysilicon). Optionally, a metal or metal silicide layer may be formed in contact with the bit lines 104 to increase conductivity. Of course, the bit lines 104 may include metal or metal silicide instead of polysilicon, if desired. In an alternate embodiment, the bit lines 104 may be formed by etching a silicon on insulator layer. Further, during operation, the bit lines 104 may serve as common lines, in a manner that will be set forth later in greater detail.

A semiconductor layer 108 is situated over the bit lines 104 and filler layer 106, as shown. While, in one embodiment, the semiconductor layer 108 may include silicon, it should be noted that any other types of semiconductor material (e.g. $Si_xGe_y$ alloy, Ge semiconductor) may also be used, as desired. The type of such semiconductor layer 108 (e.g. p-type, n-type) may further vary based on the desired configuration thereof. For example, in a three-dimensional embodiment with multiple, vertically disposed arrays of memory cells 100, arrays of both p-type and n-type semiconductor layers 108 may co-exist in the integrated circuit at different levels above and beneath each other.

In one embodiment where the semiconductor layer 108 includes a p-type semiconductor, the semiconductor layer 108 may be used to construct NMOS transistors. Specifically, N+ diffusion regions, operating as source and drain regions 120, may be disposed in the semiconductor layer 108. Further, portions of the semiconductor layer 108 between the source and drain regions 120 may comprise NMOS channel regions 121. As an option, the aforementioned NMOS transistors may include thin film transistors (TFTs).

In another embodiment, the semiconductor layer 108 may include an n-type semiconductor. To this end, the semiconductor layer 108 may be used to construct PMOS transistors, where P+ diffusion regions, operating as source and drain regions 120, are disposed in the semiconductor layer 108. Further, portions of the semiconductor layer 108 between the source and drain regions 120 may comprise PMOS channel regions 121. Of course, as previously suggested, p-type and n-type dopings may be reversed, as desired.

In one exemplary manner of construction, the source and drain regions 120 may be formed by outdiffusion of dopants from the bit lines 104. However, it should be noted that the source and drain regions 120 may be formed by any other desired method, such as by updiffusion, masking and ion implantation, etc. In use, the bit lines 104 contact the source and drain regions 120. Thus, in the context of the present description, a bit line 104 refers to any continuous rail that is, at least in part, separate from the source and drain regions 120 and used for communicating therewith.

Positioned over the semiconductor layer 108 is an insulating layer 110. In one embodiment, where MOSFET devices are desired, the insulating layer 110 may take the form of a thin silicon dioxide layer or any other suitable dielectric. Still yet, in yet another embodiment where a floating body-type cell is desired, a floating body 122 may be formed in each channel region 121 as part of the semiconductor layer 108. In the context of the present description, the floating body 122 refers to any body in the channel region 121, which stores a charge for indicating a memory cell state (e.g. on, off). In one embodiment, such floating body 122 may be employed to provide volatile memory cells 100. Of course, it should be noted that any type of technology may be employed which is capable of constructing memory cells 100 that are volatile.

While this charge storage may be accomplished in any desired manner, one embodiment may utilize a high voltage difference between the bit lines 104 (i.e. between a bit line and a common bit line) which, in turn, ensures a high field at a junction between one of the bit lines 104 and an associated drain region 120. Such high field further enables use of impact ionization during operation, as will be set forth in greater detail later.

As yet a further option, a writeable (e.g. re-writeable) floating body 122 may be provided. Of course, any desired insulating layer 110 and overlying layers, if any, may be employed, as desired, for affording different types of memory cells.

With continuing reference to FIG. 1, positioned above the insulating layer 110 is a plurality of word lines 116. In the context of the present description, a word line 116 refers to any continuous rail that is, at least in part, separate from the channel region 121 and used for communicating therewith.

While any desired number of levels of word lines 116 and bit lines 104 may be employed, a three-dimensional embodiment of memory cells 100 includes more than one level of word lines 116 or more than one level of bit lines 104, where the word lines 116 and the bit lines 104 are disposed perpendicular with respect to each other in successive planes. Further in the context of the present description, a "level" of the three-dimensional array embodiment includes a plurality of word lines 116, a plurality of bits line 104, and/or a plurality of memory cells 100 substantially positioned in a common approximate plane, although word lines 116 and bit lines 104 can be shared between levels in some embodiments.

It should be noted that the foregoing memory cell construction is set forth for illustrative purposes only and should not be considered as limiting in any manner. For even further information regarding various optional structural features that may be implemented in the context of the memory cell 100, reference may be made to a co-pending application filed coincidently herewith under Attorney Docket Number MAT1P001/MD240, naming common inventorship, and entitled "FLOATING BODY MEMORY CELL SYSTEM AND METHOD OF MANUFACTURE," which is incorporated herein by reference in its entirety for all purposes.

During use (i.e. after manufacture and testing of the memory cell), the memory cell may be programmed utilizing a two-pass write technique for enhanced operation. Specifically, a first write operation is performed on at least one memory cell (e.g. a selected memory cell) at a first time. Further, at a second time, a second write operation is performed on at least one memory cell (e.g. a selected memory cell).

As an option, either the first write operation or the second write operation may be a write on (i.e. write "1") operation, and either the first write operation or the second write operation may be a write off (i.e. write "0") operation. Further, more specifically, the first write operation may, in one embodiment, be the write off operation, while the second write operation is the write on operation. While either write operation may precede the other, in various embodiments, the first time occurs prior to the second time. To this end, the write off operation precedes the write on operation.

In one aspect of the present embodiment, during use, a voltage at a corresponding word line associated with the at least one memory cell during the first write operation may be different than that during the second write operation. Further during use, in an additional aspect of the present embodiment, a voltage at a corresponding word line associated with at least one unselected memory cell during the first write operation may be different than that during the second write operation. In still another aspect of the present embodiment, during use, a voltage at a corresponding bit line common associated with at least one unselected memory cell during the first write operation may be different than that during the second write operation.

Also during use, the aforementioned write off operation may be performed on at least one memory cell by applying a first voltage to a corresponding bit line associated with the at least one memory cell. Further, a second voltage may be applied to a corresponding word line associated with at least one other memory cell which is in communication with the corresponding bit line. Such first voltage and second voltage may be negative voltages and, during use, a magnitude of the second voltage may be greater than a magnitude of the first voltage.

The foregoing voltage relationships, separately and/or in combination, provide for enhanced operation during programming. Just by way of example, an increase in signal strength may optionally be realized. More illustrative information will now be set forth regarding such enhancements as well as various optional architectures and/or functional features with which the foregoing programming may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
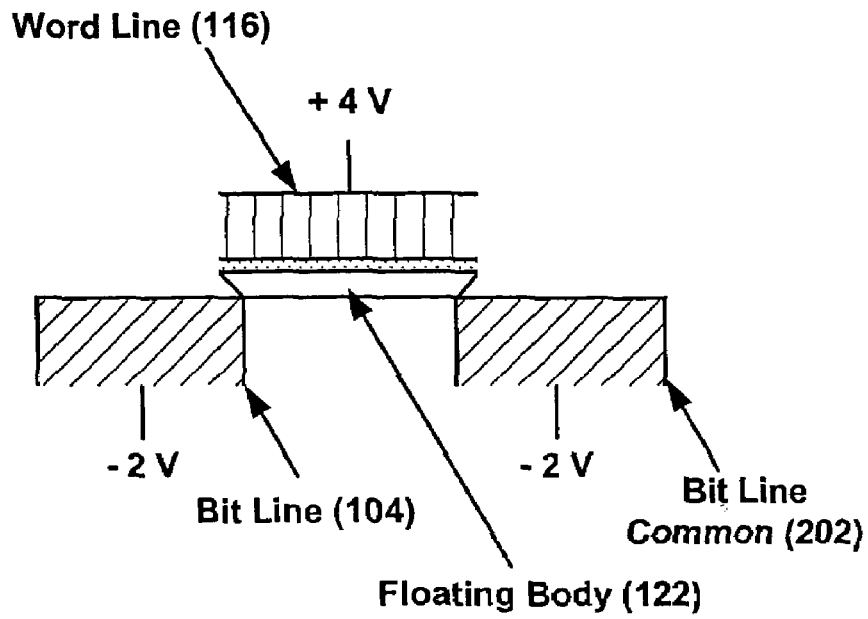
FIGS. 2A and 2B illustrate one of the memory cells encircled in FIG. 1 in use during an exemplary write off operation and write on operation, respectively.
Figure 2B:
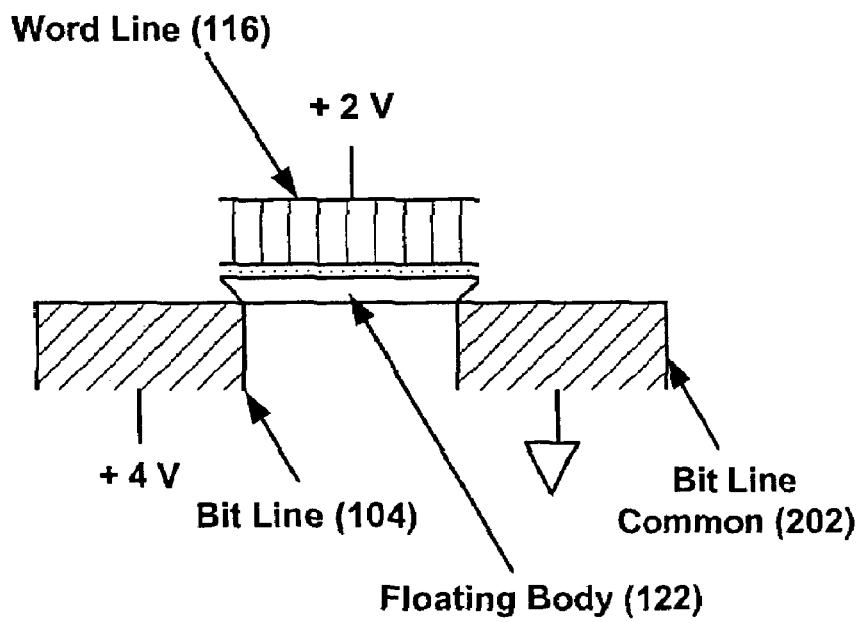

FIGS. 2A and 2B illustrate one of the memory cells encircled in FIG. 1 in use during an exemplary write off operation and write on operation, respectively. In use, one of the bit lines 104 operates as a common bit line 202, while the word line 116 operates as a gate over the floating body 122. More information regarding the designation of the common bit line 202 will be set forth later in greater detail.

As shown in FIG. 2A, a write off operation may be carried out on a first memory cell by applying +4V to the word line 116, applying −2V to the associated selected bit line (BLS) 104 as well as the common bit line 202. Note Table 1 below:

TABLE 1

| Write 0 |
| --- |
| WL: +4 V |
| BLS: −2 V |
| BL Common: −2 V |

With reference now to FIG. 2B, a write on operation may be carried out by applying +2V to the word line 116, and applying +4 V to the associated selected bit line (BLS) 104, while the common bit line 202 is maintained at GND. Note Table 2 below:

TABLE 2

| Write 0 |
| --- |
| WL: +2 V |
| BLS: +4 V |
| BL Common: GND |

It should be noted that the foregoing voltages are set forth for illustrative purposes only and should not be construed as limiting in any manner. More information will now be set forth regarding various optional configurations of memory cells and the operation thereof.

Figure 3:
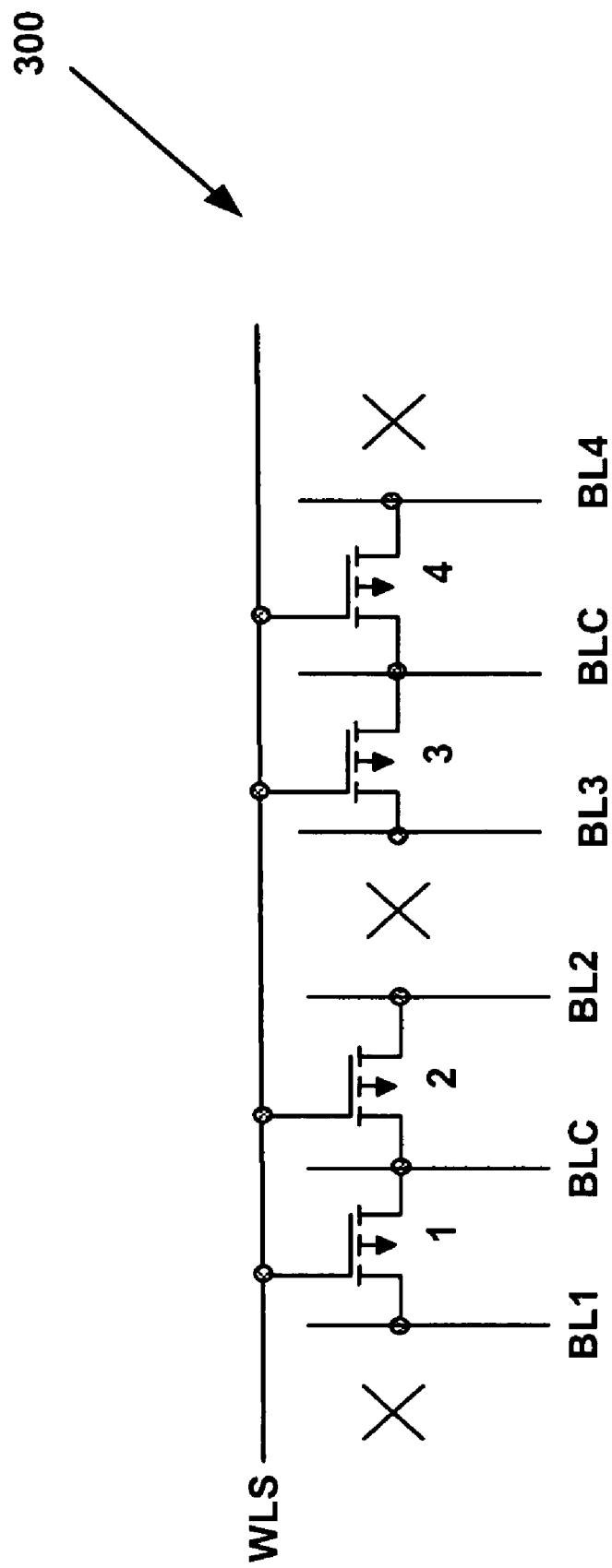
FIG. 3 illustrates an electrical schematic diagram of an array of memory cells, in accordance with one embodiment.

FIG. 3 illustrates an electrical schematic diagram of an array of memory cells 300, in accordance with one embodiment. In the present embodiment, channel regions are removed from some potential memory cells before the corresponding word line is formed, so that only a portion (e.g. half) of the cells along the bit line are formed. In particular, no cell exists between bit line BL2 and bit line BL3, as shown, for improved write selectivity. A "$6F^2$" design is thus provided, with memory cells that are each six (6) times the feature size (F), squared. Optionally, a channel trim operation may be used to remove the channel region from locations where no memory cells are desired. Another optional arrangement ignores memory cells that exist at some locations along the bit line for reading and writing operations.

To this end, an adjacent pair of the memory cells (e.g. ½, ¾) which are associated with one of the word lines (e.g. WLS) may be further associated with less than four bit lines (e.g. BL1/BLC/BL2, BL3/BLC/BL4, respectively). As further shown, at least one of the bit lines may be shared among a plurality of the memory cells that are also sharing a word line. In such embodiment, the plurality of the memory cells sharing the at least one bit line simultaneously with the one word line may store a parity bit with data bits stored in the memory cells. Further, bits of a user word may be stored in spaced groups of adjacent memory cells associated with one of the word lines, where each group includes less than three memory cells.

Figure 4A:
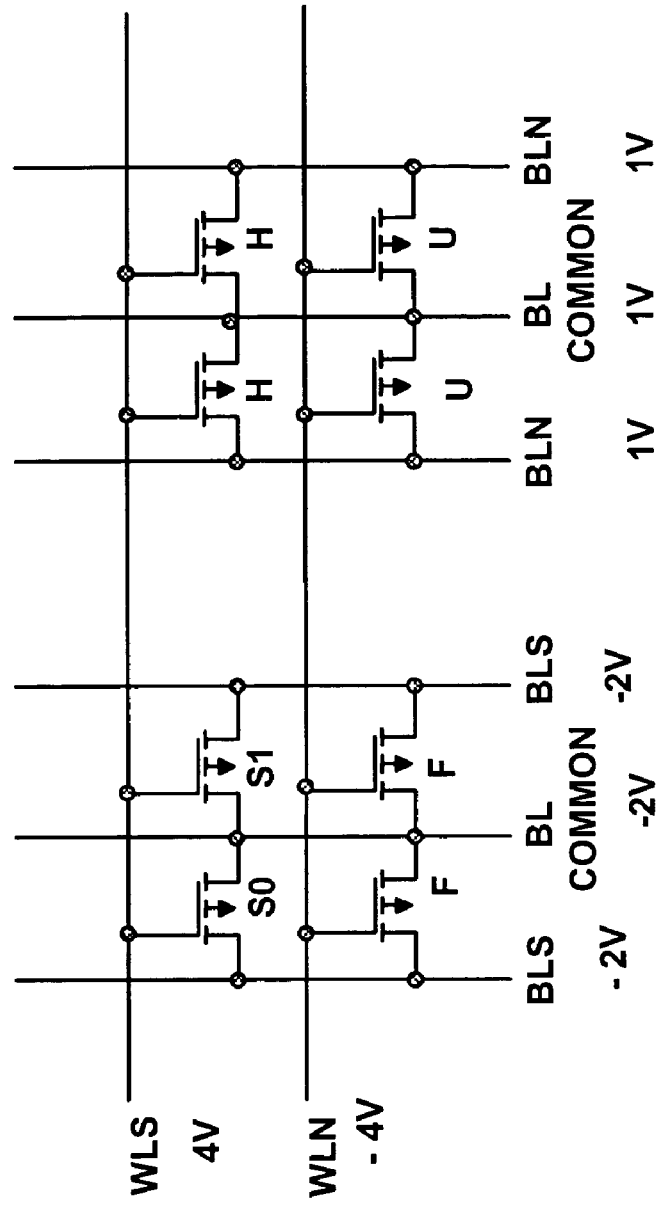
FIG. 4A illustrates an electrical schematic diagram of a memory array which may be constructed utilizing the memory cells of FIG. 1 and design of FIG. 3, where a write off operation is being performed.

FIG. 4A illustrates an electrical schematic diagram of a memory array 400 which may be constructed utilizing the memory cells of FIG. 1 and design of FIG. 3, where a write off operation is being performed. As shown, the memory array 400 includes a plurality of memory cells S0, S1, H, F, U, which are interconnected by a plurality of word lines WLS (word line selected), WLN (word line not-selected) and bit lines BLS (bit line selected), BLCommon (bit line common), BLN (bit line not-selected), in the manner shown.

Thus, memory cells S0 and S1 are selected by virtue of the associated selected word and bit lines WLS, BLS. While the adjacent pair of memory cells S0 and S1 are shown to be selected for writing simultaneously, it should be noted that, in various embodiments, only one of the memory cells (e.g. S0 or S1) may be written at a time. Further, the remaining memory cells H, F, U are not selected by virtue of the associated unselected word and/or bit lines WLN, BLN.

During use, the write off operation is performed on at least one memory cell (e.g. memory cell(s) S0 and/or S1) by applying a first voltage to a corresponding bit line (e.g. BLS) associated with the at least one memory cell. Further, a second voltage is applied to a corresponding word line (e.g. WLN) associated with at least one other memory cell (e.g. memory cell(s) F) which is in communication with the corresponding bit line.

As shown, such first voltage and second voltage are negative voltages. Still yet, during use, a magnitude of the second voltage is greater than a magnitude of the first voltage. As an option, the magnitude of the second voltage may be twice the magnitude of the first voltage. To make the foregoing voltage relationship possible, the magnitude of the first voltage may be half a magnitude of an available voltage.

In one exemplary embodiment, the first voltage may be −2V and the second voltage may be −4V, as shown. Still yet, the available voltage may be −4V. It should be noted that, the greater the negative voltage, the greater the signal difference that can be stored. Of course, however, any desired first and second voltage may be used which meet the foregoing voltage relationship.

In the context of an embodiment where the at least one memory cell (e.g. memory cell(s) S0 and/or S1) includes a floating body, the aforementioned second voltage may force the floating body of the at least one other memory cell (e.g. memory cell(s) F) to a negative voltage. Further, the write off operation may discharge the charge utilizing a forward bias junction from the floating body to a corresponding bit line (e.g. BLS) associated with the at least one memory cell. This may optionally provide for a faster write off operation.

Further, with respect to other, unselected memory cells (e.g. memory cell(s) H), a positive bit line voltage (e.g. $V_{BLN(W0)}$) greater than that on the floating body of memory cells (which are not being written but share the selected word line) is applied to avoid forward bias of such floating bodies that are storing a "1." A maximum positive voltage may be applied to such bit line (e.g. BLN), where such positive voltage is about half the difference between the selected word line voltage for write 0 and write 1 (or about 1V), as will soon become apparent.

As further shown, a negative voltage may be applied to a corresponding bit line common (e.g. BLC) associated with the at least one memory cell (e.g. memory cell(s) S0 and/or S1) for preventing current from flowing through the at least one memory cell.

Figure 4B:
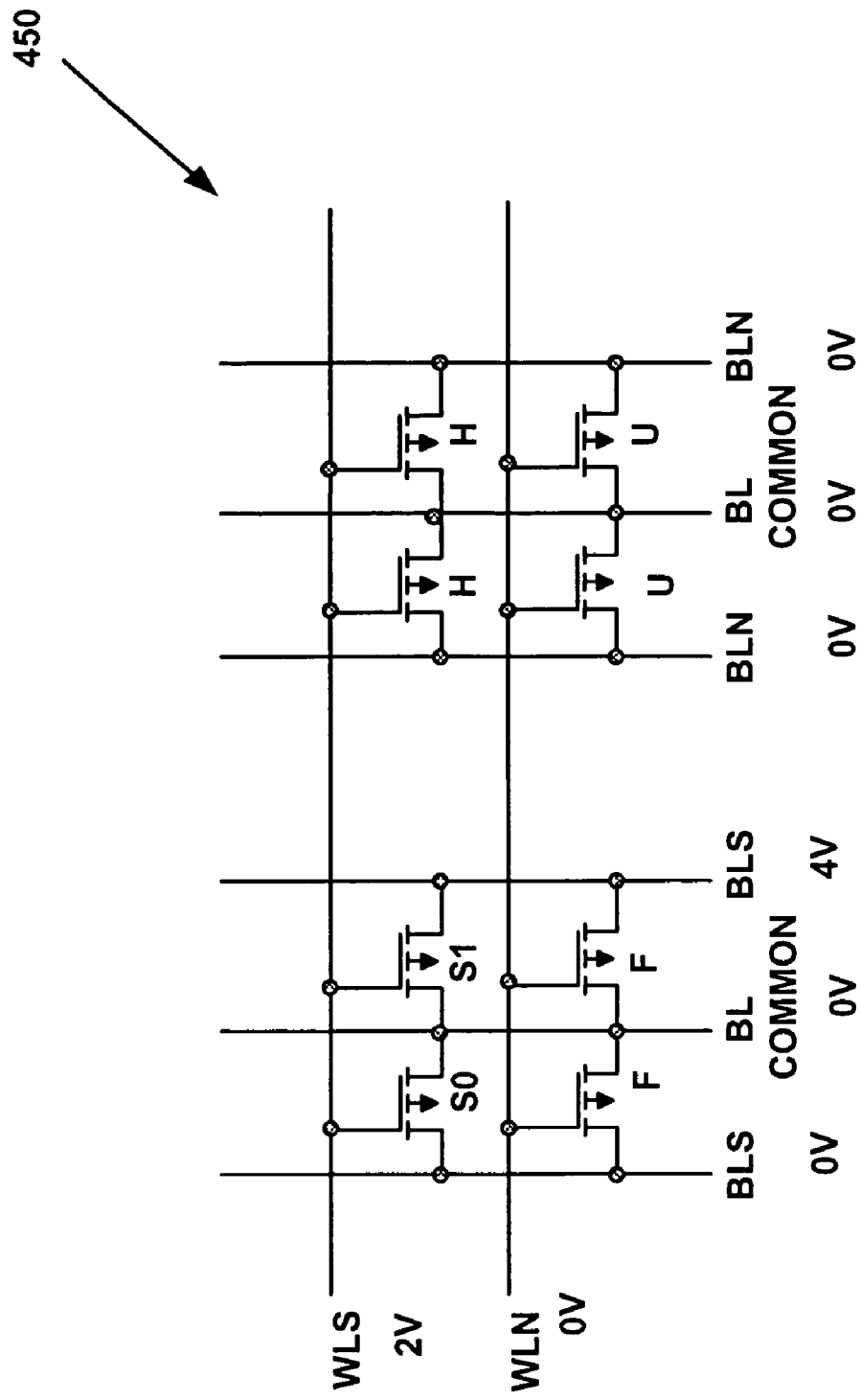
FIG. 4B illustrates an electrical schematic diagram of a memory array which may be constructed utilizing the memory cells of FIG. 1 and design of FIG. 3, where a write on operation is being performed.
Figure 4C:
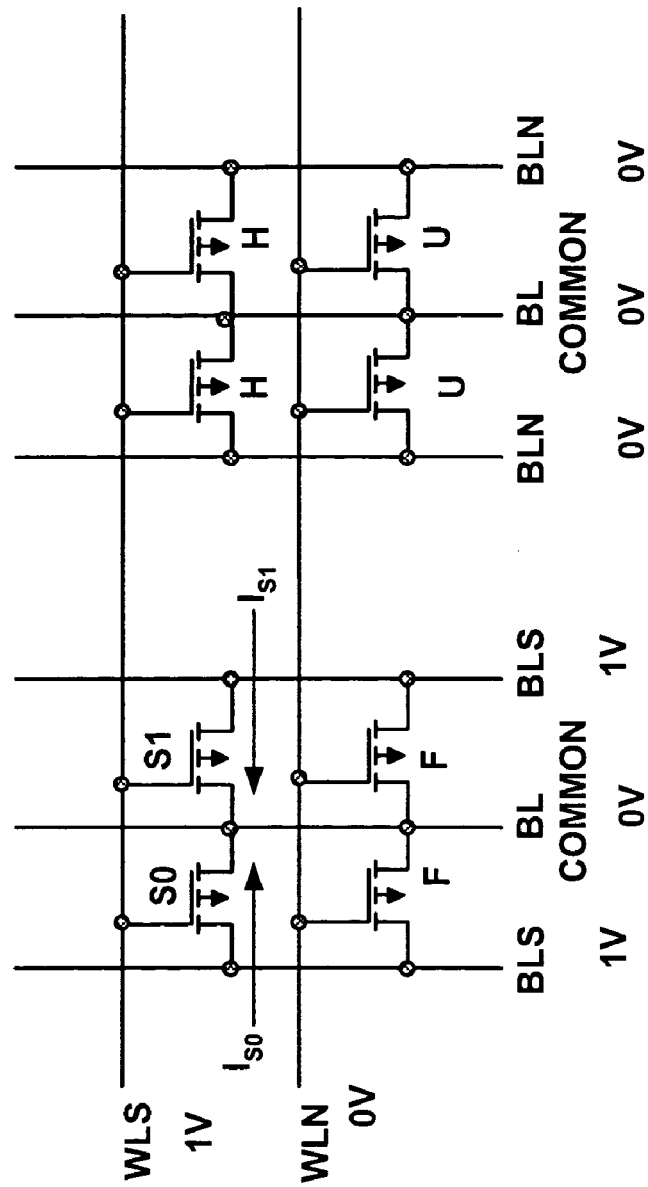
FIG. 4C illustrates an electrical schematic diagram of a memory array which may be constructed utilizing the memory cells of FIG. 1 and design of FIG. 3, where a read operation is being performed.

More information will be set forth regarding an associated read operation during reference to FIG. 4C. In one embodiment, the foregoing write off operation may utilize a bit line voltage (e.g. $V_{BLS(W0)}$) which is less than a reference voltage applied during a read operation (which will be described hereinafter in greater detail). Such reference voltage may be a bit line common voltage (e.g. $V_{BLC(R)}$).

It should be noted that the voltages set forth in FIG. 4A and remaining related figures are illustrative in nature and should not be construed as limiting in any manner. Such voltages may differ in magnitude and polarity in other embodiments depending on device specifics (e.g. specific device sizes, technology characteristics). For example, in future scaled technologies, generally lower voltages are desirable.

FIG. 4B illustrates an electrical schematic diagram of a memory array 450 which may be constructed utilizing the memory cells of FIG. 1 and design of FIG. 3, where a write on operation is being performed. Similar to the memory array 400 of FIG. 4A, the memory array 450 includes a plurality of memory cells S0, S1, H, F, U, which are interconnected by a plurality of word lines WLS (word line selected), WLN (word line not-selected) and bit lines BLS (bit line selected), BLCommon (bit line common), BLN (bit line not-selected), in the manner shown.

It should be noted, however, that the memory cell(s) written during the first write operation (e.g. write 0 operation) of FIG. 4A and the memory cell(s) written during the present second write operation (e.g. write 1 operation) may or may not be the same memory cell(s). In other words, in one embodiment, the at least one memory cell on which the first write operation is performed may be the same as the at least one memory cell on which the second write operation is performed. On the other hand, in another embodiment, the at least one memory cell on which the first write operation is performed may be different from the at least one memory cell on which the second write operation is performed.

During use, a voltage at a corresponding word line (e.g. WLS) associated with the at least one memory cell (e.g. memory cell(s) S0 and/or S1) during the first write operation may be different than that during the second write operation. In one embodiment, the voltage at the corresponding word line may be 4V during the first write operation (see FIG. 4A), and further be 2V during the second write operation, as shown. Of course, in this and any other instance where voltages are different, it should be understood that such voltages may also be the same, in other embodiments, if desired.

Further during use, a voltage at a corresponding word line (e.g. WLN) associated with at least one unselected memory cell (e.g. memory cell(s) F) during the first write operation may be different than that during the second write operation. In one embodiment, the voltage at the corresponding word line may be −4V during the first write operation (see FIG. 4A), and further be 0V during the second write operation, as shown. Such 0V may be used to shut off the at least one unselected memory cell that would otherwise waste power.

Even still during use, a voltage at a corresponding bit line common (e.g. BLC) associated with at least one unselected memory cell (e.g. memory cell(s) F) during the first write operation may be different than that during the second write operation. In one embodiment, the voltage at the corresponding bit line common may be −2V during the first write operation (see FIG. 4A), and further be 0V during the second write operation, as shown.

During the write on operation, bit line voltages (e.g. $V_{BLN(W1)}$) associated with at least one other memory cell (e.g. memory cell(s) H, U) change based on which memory cell is selected. Also, the write on operation may utilize a bit line voltage (e.g. $V_{BLS(W1)}$) and a word line voltage (e.g. $V_{WLS(W1)}$) which are each greater than a bit line common voltage (e.g. $V_{BLC(W1)}$). Still yet, a maximum positive voltage may be applied to the corresponding bit line, where the selected word line is about half this maximum.

More information will be set forth regarding an associated read operation during reference to FIG. 4C. As will soon become apparent, the foregoing write on operation may utilize a bit line voltage (e.g. $V_{BLS(W1)}$) which is greater than a reference voltage applied during a read operation (which will be described hereinafter in greater detail). Such reference voltage may be a bit line common voltage (e.g. $V_{BLC(R)}$).

As shown in FIG. 4B, one of the selected bit line voltages is different than the other (e.g. one at ground and the other at a maximum voltage). Thus, only one of the bit line voltages meets the foregoing voltage relationship. In one embodiment, the write on mechanism may be selective to one memory cell of a pair that share a bit line, since it requires the memory cell to be conducting in saturation (i.e. a high drain voltage on a first bit line and a low source voltage on a second bit line).

Further, in the context of an embodiment where the at least one memory cell (e.g. memory cell(s) S0 and/or S1) includes a floating body the write on operation may utilize current flowing between a corresponding bit line (e.g. BLS) and a corresponding bit line common (e.g. BLC) associated with the at least one memory cell. Further during the write on operation, the at least one memory cell may operate in saturation and holes may be injected into the floating body.

Optionally, during the write on operation, a partial write on operation may be performed on at least one other memory cell (e.g. memory cell(s) H). Further, the partial write on operation may utilize a bit line voltage (e.g. $V_{BLN(W1)}$) which is less than the selected bit line voltage (e.g. $V_{BLS(W1)}$). Such a partial write one operation may be preformed on any unselected memory (e.g. memory cell(s) H) cells, during the write on operation. Further, the partial write on operation serves to replenish holes which may have been destroyed while cycling the associated word line (e.g. WLS) up and down. The partial write on operation may have the same word line voltage (e.g. $V_{WLS(W1)}$) and the bit line common voltage (e.g. $V_{BLC(W1)}$) may be maintained at ground, while a lower positive bit line voltage (e.g. $V_{BLN(W1)}$) is applied to the bit line with respect to the write on operation.

FIG. 4C illustrates an electrical schematic diagram of a memory array 475 which may be constructed utilizing the memory cells of FIG. 1 and design of FIG. 3, where a read operation is being performed. Similar to the memory arrays 400, 450 of FIGS. 4A and 4B, the memory array 475 includes a plurality of memory cells S0, S1, H, F, U, which are interconnected by a plurality of word lines WLS (word line selected), WLN (word line not-selected) and bit lines BLS (bit line selected), BLCommon (bit line common), BLN (bit line not-selected), in the manner shown.

As is now apparent, the write off operation may utilize a bit line voltage (e.g. $V_{BLS(W0)}$) which is less than a reference voltage applied during a read operation. Such reference voltage may be a bit line common voltage (e.g. $V_{BLC(R)}$). For example, the write off bit line voltage may be −2V (see FIG. 4A) and the read bit line common voltage may be 0V, as shown. Of course, however, any desired voltages may be used which meet the foregoing voltage relationship.

Further, the write on operation may utilize a bit line voltage (e.g. $V_{BLS(W1)}$) which is greater than a reference voltage applied during a read operation. Such reference voltage may, again, be the bit line common voltage (e.g. $V_{BLC(R)}$). For example, the write one bit line voltage may be 4V (see FIG. 4B) and the bit line common voltage may be 0V, as shown. Of course, however, any desired voltages may be used which meet the foregoing voltage relationship.

By this structure, sensing circuits may hold the corresponding bit line at about 1V and sense the current into the cell (see current $I_{S0}$ and $I_{S1}$). For example, a low current may be indicative of a "0" state. Moreover, a high current may be indicative of a "1" state.

As an option during use, a plurality of the memory cells associated with the corresponding word line (e.g. WLS) which are written during a first write operation and a plurality of the memory cells associated with the corresponding word line (e.g. WLS) which are written during a second write operation may be read during a single read cycle. Further, a page of data may be read utilizing at least two read cycles. In other words, a first portion of a page of data may be read utilizing a first read cycle, and a second portion of the page of data may be read utilizing a second read cycle, etc. As a further option, bits for a user word may be read in alternating pairs of the memory cells associated with one of the word lines. As an alternative option, bits for a user word may be stored in groups of adjacent memory cells that are greater than two and subsequently read in at least two read cycles. As still yet another option, the write off operation (see FIG. 4A) may occur at least in part coincidently with a read operation involving a page of data stored utilizing a plurality of the memory cells.

Table 3 illustrates the exemplary voltage relationships set forth hereinabove with respect to FIGS. 4A, 4B, and 4C. Of course, any of the following relationship may be used with the inclusion and/or exclusion of other relationships shown (and even not shown).

Figure 5:
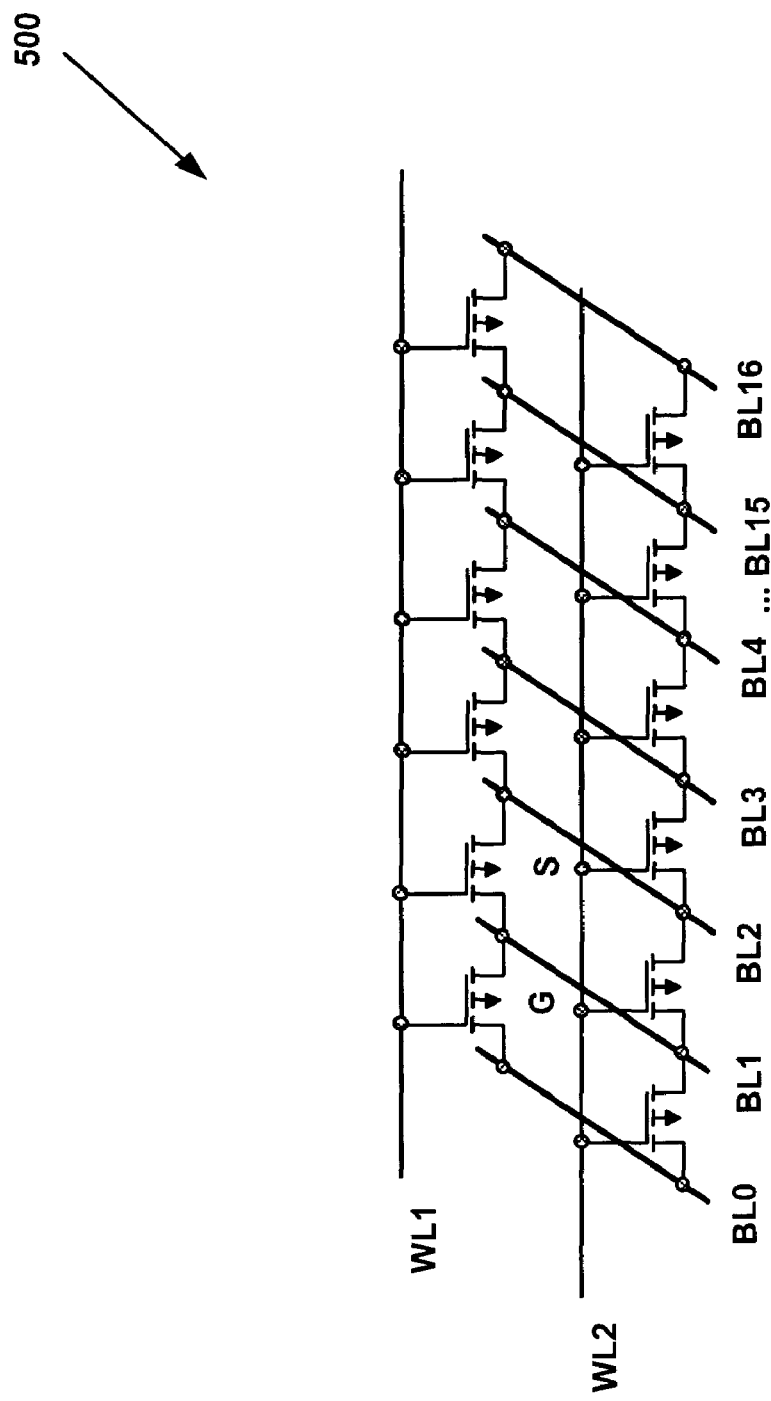
FIG. 5 illustrates another array of memory cells different from that of FIG. 3, in accordance with another embodiment.

FIG. 5 illustrates an array of memory cells 500, which are each formed at the intersections of respective bit lines BL1, BL2, BL3, BL4 . . . BL15, BL16, etc. and word lines WL1, WL2, etc. Specifically, the memory cells 500 are positioned at the various indicated locations (i.e. on both sides of the bit lines at each intersection with the word lines), providing a "$4F^2$" cell that is four (4) times the feature size (F), squared and less than the "$6F^2$" achieved in FIG. 3. While different embodiments will be described later, a shared bit line array embodiment will first be set forth.

In use, the role of the bit lines BL0, BL1, etc. as a common line or not is determined as a function of which memory cell(s) is selected via the associated word lines WL1, WL2, etc. For example, if memory cells G and S are selected by selecting word line WL1 and bit lines BL0 and BL2, bit lines BL0 and BL2 may serve as selected bit lines, while bit line BL1 may serve as a bit line common. Of course, a write 1 mechanism may also be selective to one cell of each pair which shares a bit line, since it requires the cell to be conducting in saturation.

Figure 6:
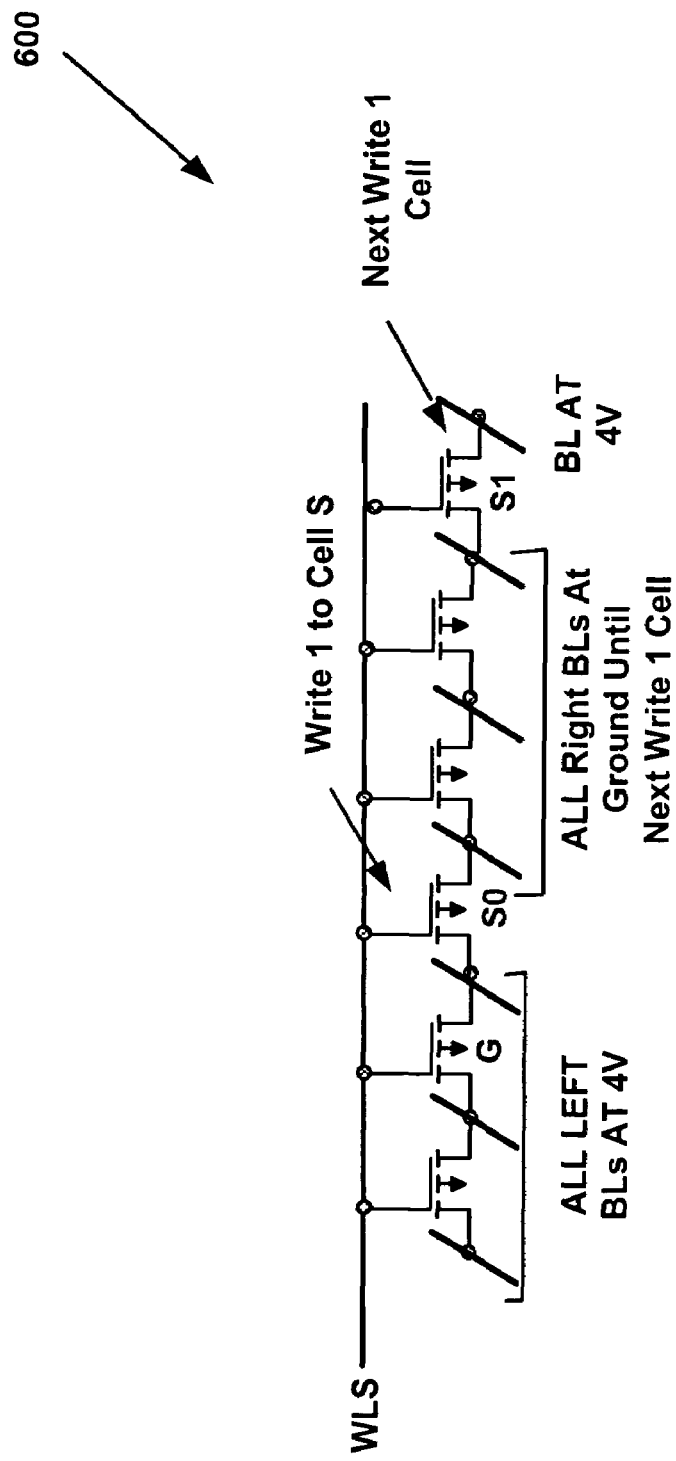
FIG. 6 illustrates an electrical schematic diagram of a memory array which may be constructed in accordance with the embodiment of FIG. 5.

FIG. 6 illustrates an electrical schematic diagram showing a memory array 600 which may be constructed in accordance with the present embodiment. As shown, a selected cell S0 may be flanked to the left by bit lines at a first voltage and to the right by bit lines at a second voltage. Since an odd number of memory cells written to one would require one side of the memory array 600 to be ground but the other charged to a predetermined voltage, the mat of memory cells may be broken occasionally by eliminating one of the memory cells along the word lines, or ignoring one of such memory cells.

During both write and read operations, a single cell on a bit line may be active. However, on the other hand, several cells may be active by alternating groups of high bit lines and low bit lines. In the context of a write mechanism using impact ionization or field induced leakage, such write mechanism depends on the presence of some drain-to-source voltage. Thus, an adjacent cell is likely subjected to very low leakage generation.

In some embodiments of the foregoing $4F^2$ layout, a write off operation may not necessarily be selective to a single bit associated with a cell. Instead, a pair of bits may be written off when an associated word line is high and a bit line is low. In such embodiment, the bit pairs may reside within the same user word delivered to the memory for writing. Such words are typically 1 to 4 bytes in length. As an option, all bits may be written off in a word, whereafter selected bits are written on, so that no data is lost during use.

Figure 7A:
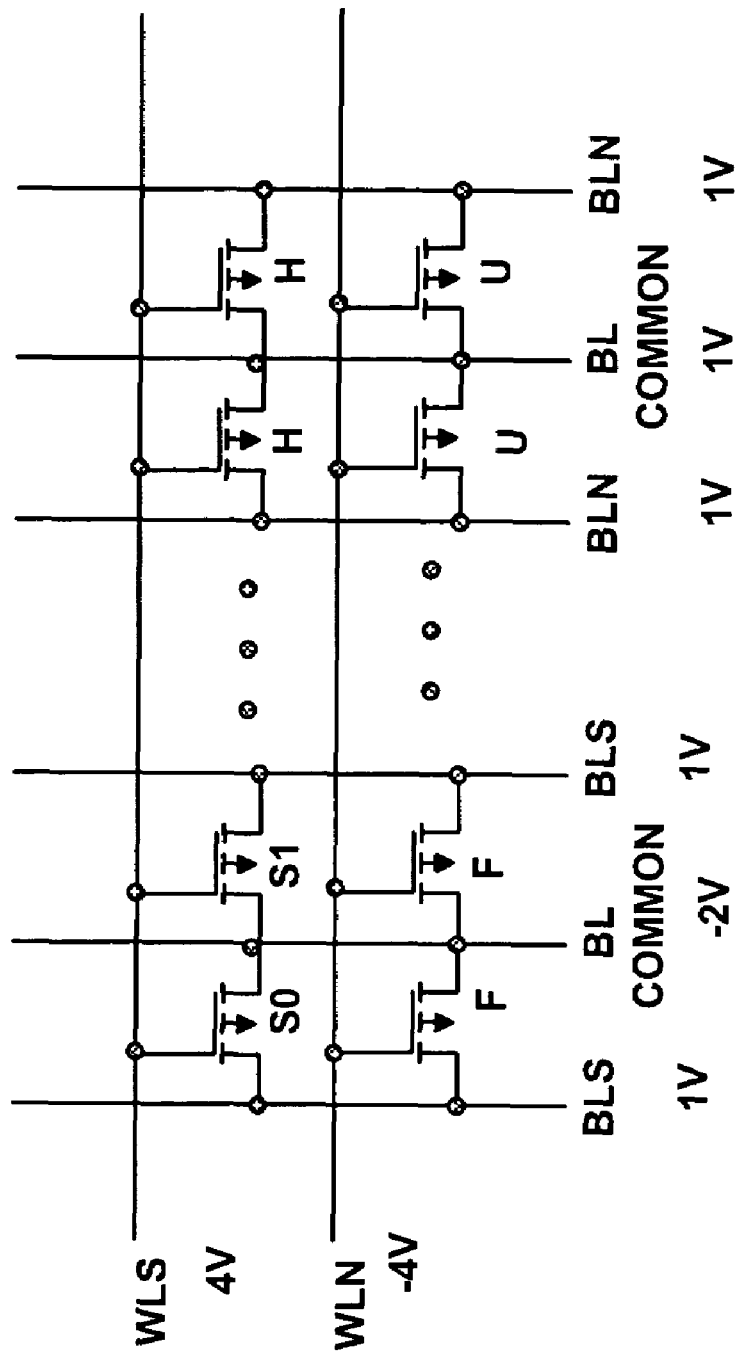
FIG. 7A illustrates an electrical schematic diagram of a memory array which may be constructed utilizing the memory cells of FIG. 1 and the design of FIGS. 5-6, where a write off operation is being performed.
Figure 7B:
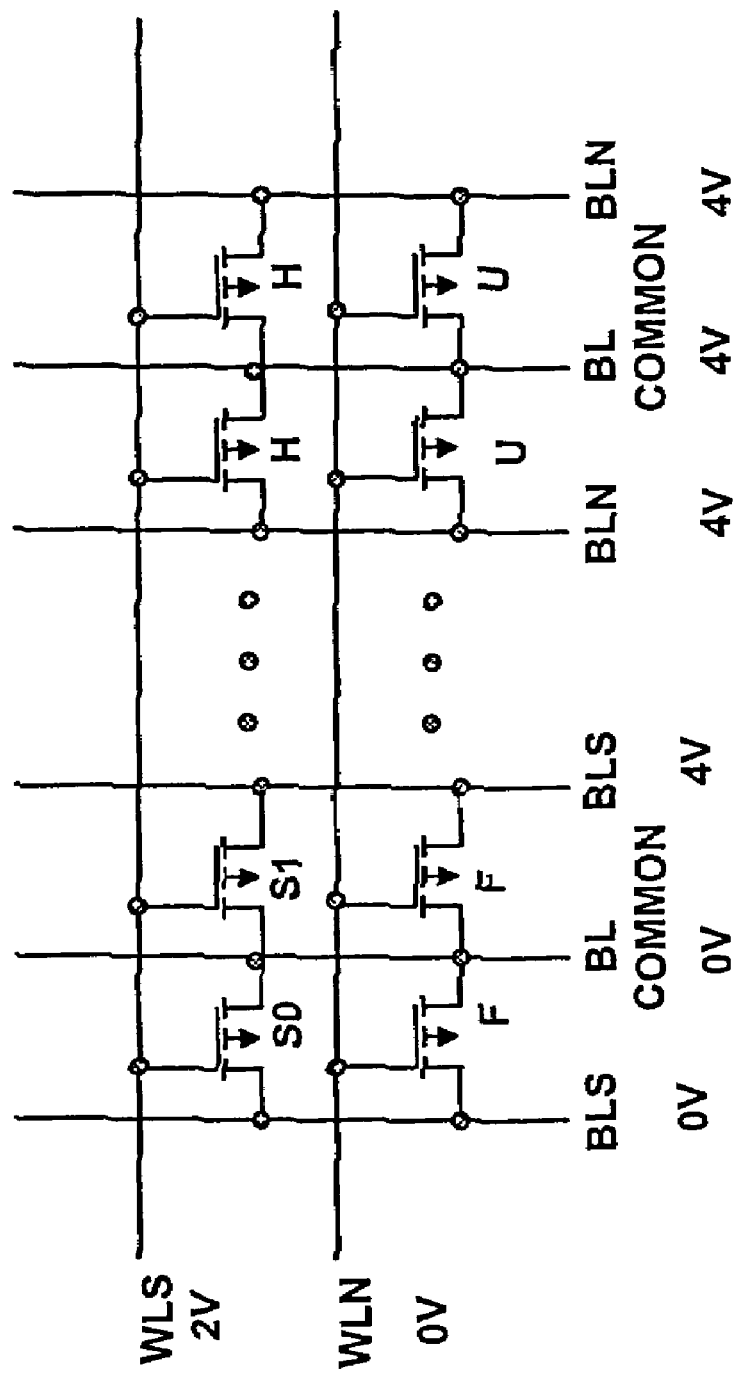
FIG. 7B illustrates an electrical schematic diagram of a memory array which may be constructed utilizing the memory cells of FIG. 1 and the design of FIGS. 5-6, where a write on operation is being performed.
Figure 7C:
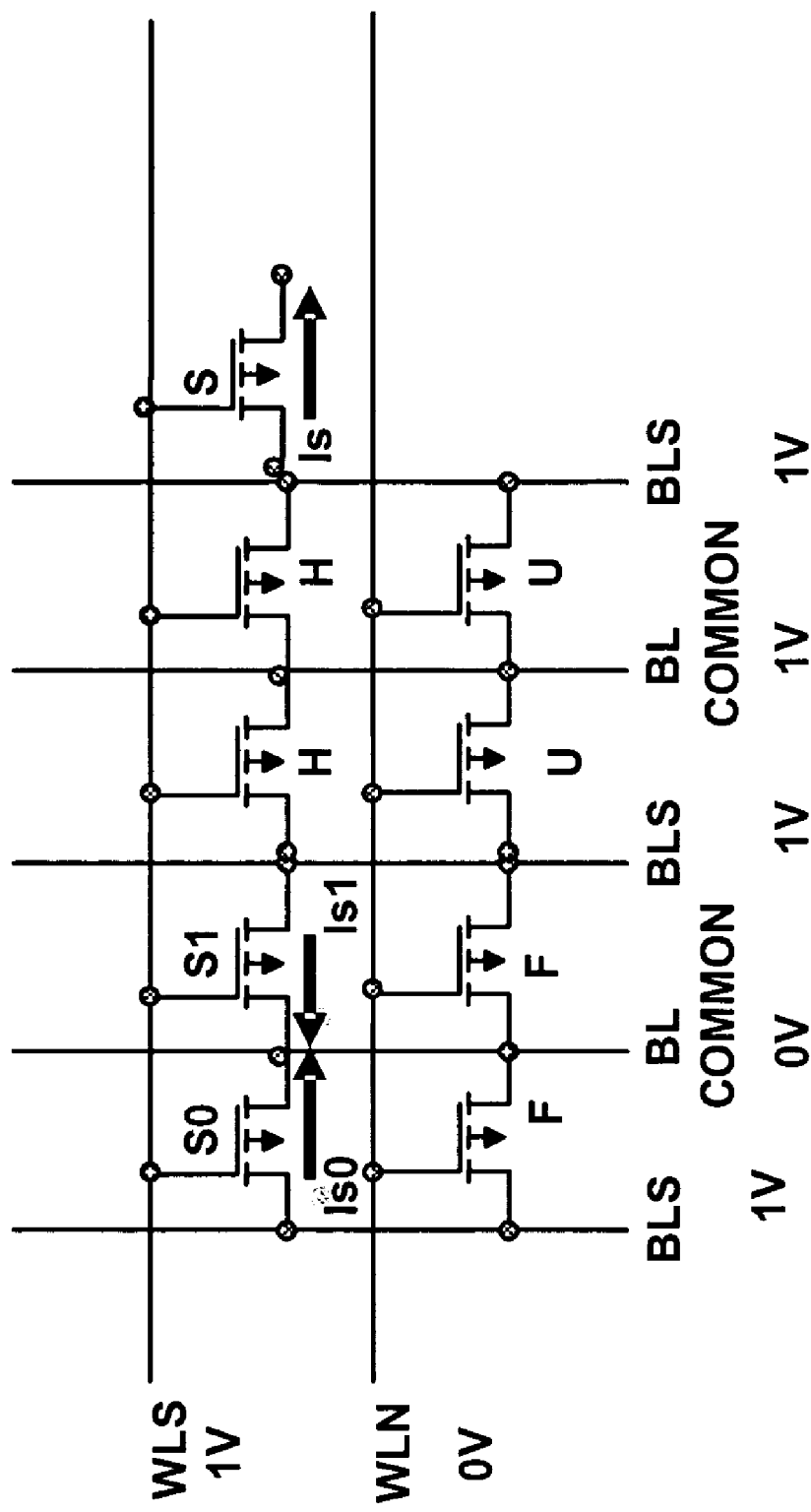
FIG. 7C illustrates an electrical schematic diagram of a memory array which may be constructed utilizing the memory cells of FIG. 1 and the design of FIGS. 5-6, where a read operation is being performed.

Similar to the previously described embodiment, a bias voltage may be different for write on and write off operations in the present two-pass write embodiment. FIGS. 7A–7C illustrate such feature. As shown in FIGS. 7A–7C, the memory array includes a plurality of memory cells S0, S1, H, F, U, which are interconnected by a plurality of word lines WLS (word line selected), WLN (word line not-

TABLE 3

| Array Line/Operation | WLS | BLC/BLN | WLN | BLS |
|---|---|---|---|---|
| Write 0 (W0) | $V_{WLS(W0)} \neq V_{WLS(W1)}$ | $V_{BLC(W0)} < 0\ V$; $V_{BLC(W0)} \neq V_{BLC(W1)}$ | $V_{WLN(W0)} >$ Abs $(V_{BLS(W0)})$; $V_{WLN(W0)} \neq V_{WLN(W1)}$ | $V_{BLS(W0)} < V_{BLC(R)}$ |
| Write 1 (W1) | $V_{WLS(W1)} \neq V_{WLS(W0)}$ | $V_{BLC(W1)} \neq V_{BLC(W0)}$ | $V_{WLN(W1)} \neq V_{WLN(W0)}$ | $V_{BLS(W1)} > V_{BLC(R)}$ |
| Read (R) | $V_{WLS(R)}$ | $V_{BLC(R)}$ | $V_{WLN(R)}$ | $V_{BLS(R)}$ | selected) and bit lines BLS (bit line selected), BLCommon (bit line common), BLN (bit line not-selected), in the manner shown.

Thus, memory cells S0 and S1 are selected by virtue of the associated selected word and bit lines WLS, BLS. While the adjacent pair of memory cells S0 and S1 are shown to be selected for writing off simultaneously in FIG. 7A, it should be noted that only one of the memory cells (e.g. S0 or S1) may be written at a time. Further, the remaining memory cells H, F, U are not selected by virtue of the associated unselected word and/or bit lines WLN, BLN.

Table 4 illustrates the exemplary voltages set forth in FIGS. 7A, 7B, and 7C. It should be noted that the voltages of Table 4 substantially conform to the relationships set forth in Table 3 (as indicated below in Table 4). In the present example, however, $V_{BLS(W0)} < V_{BLC(R)}$ is not adhered to. Of course, any of the foregoing relationships and following voltages may be used with the inclusion and/or exclusion of other relationships shown (and even not shown).

is pulled to a negative voltage to write zero. Optionally, the other two bit lines associated with the pair are at a positive voltage to avoid a forward bias from the floating body of adjacent memory cells. This provides the optional advantage of writing a zero to just selected memory cell pairs, particularly alternating pairs that can be read simultaneously. The pairs of bits may be within the same user transfer of data, which could be 1 to 4 bytes (or even more), so all data will be proper after completing the two step write operations and all data for the user word can be read in one cycle.

An alternative write off operation may be used to hold all the bit lines for a large group of cells at −2 volts to minimize power. This may be suitable for memory that transfers a page of data (e.g. 512 bytes). The specific data for every memory cell is not needed since all cells in the page are written to zero. Still yet, the write off operation may overlap the time the user is transferring the page of data to a memory chip buffer.

TABLE 4

| Array Line/Operation | WLS | BLC/BLN | WLN | BLS |
|---|---|---|---|---|
| Write 0 (W0) | $V_{WLS(W0)} = 4$ V; $V_{WLS(W0)} \ne V_{WLS(W1)}$ | $V_{BLC(W0)} = -2$ V; $V_{BLC(W0)} < 0$ V; $V_{BLC(W0)} \ne V_{BLC(W1)}$ | $V_{WLN(W0)} = -4$ V; $V_{WLN(W0)} > $ Abs $(V_{BLS(W0)})$; $V_{WLN(W0)} \ne V_{WLN(W1)}$ | $V_{BLS(W0)} = 1$ V |
| Write 1 (W1) | $V_{WLS(W1)} = 2$ V; $V_{WLS(W1)} \ne V_{WLS(W0)}$ | $V_{BLC(W1)} = 0$ V; $V_{BLC(W1)} \ne V_{BLC(W0)}$ | $V_{WLN(W1)} = 0$ V; $V_{WLN(W1)} \ne V_{WLN(W0)}$ | $V_{BLS(W1)} = 4$ V; $V_{BLS(W1)} > V_{BLC(R)}$ |
| Read (R) | $V_{WLS(R)} = 1$ V; | $V_{BLC(W0)} = 0$ V; $V_{BLC(R)}$ | $V_{WLN(R)} = 0$ V; | $V_{BLS(R)} = 1$ V; |

By employing a bias voltage that is different for write on and write off operations, an optional benefit is incurred for allowing a higher word line voltage for write off operations, with respect to write on operations. Further, a bit line common voltage may be taken negative during write off operations to discharge an associated floating body.

Thus, a difference in a word line level during write on and write off operations, respectively, may be employed for improved use. In particular, since a write on operation (i.e. charging) is at a lower voltage, the associated cell is more saturated, and the floating body does not necessarily couple as low when the word line returns to ground. Further, since a write off operation (i.e. charge floating body) is at a high word line voltage, the floating body couples low as the word line returns to ground, which gives an even lower threshold voltage. Thus, a lower voltage is produced on the floating body as well as more signal difference when sensing a corresponding memory cell. It should be noted that the present technique may be conceivably used in an environment which is not selective between a pair of cells, as in the present two-pass write embodiment. Further, a set of bit lines may be used which is as large as an input word size from a chip interface, for shared bit line and bit line common groups.

FIG. 7A illustrates an electrical schematic diagram of a memory array which may be constructed utilizing the memory cells of FIG. 1 and the design of FIGS. 5-6, where the write off operation is being performed. Because the bit lines are shared between a pair of cells, the write off operation is not necessarily selective to a single memory cell since a pair of memory cells is written to zero when the corresponding word line is high and the bit line common is negative. The bit line common of each pair of memory cells FIG. 7B illustrates an electrical schematic diagram of a memory array which may be constructed utilizing the memory cells of FIG. 1 and the design of FIGS. 5-6, where the write on operation is being performed. The write on operation is performed on the memory cell with the selected word line at an intermediate voltage and the selected bit line at a highest voltage. The voltage the bit lines may change depending on any need to write a 1 to a single memory cell. For writing a 1 to an arbitrary set of memory cells in a group, the bit lines may be controlled such that adjacent bit lines have a different voltage for memory cells that are being written. The first and last bit line in a group may have a different voltage if the number of 1's is odd. Therefore, the entire array to one side of the group may have all associated bit lines at a high bit line voltage.

Optionally, some bit lines may not be shared at the end of some memory cell groups so that bit lines beyond the group may be at ground even if the number of memory cells written to 1 is odd. In various embodiments, the break location may either have no cell or a cell that is ignored. As yet another option, the data may be written with a parity bit so that the total number of cells subjected to a write 1 operation is even. In such embodiment, the first and last bit line associated with the data may be at ground such that there is no wasted cell location. For example, a cell located at the end of the group may contain the parity data with no loss in area.

FIG. 7C illustrates an electrical schematic diagram of a memory array which may be constructed utilizing the memory cells of FIG. 1 and the design of FIGS. 5-6, where the read operation is being performed. Alternating pairs of memory cells sharing a bit line (which is used as a bit line common) may be sensed in a first read cycle. At least one of the intervening pairs may be sensed during a second read cycle. The bit line common is pulled to ground to sense the pair of cells. Further, alternating pairs may include all the memory bits in one user transfer of data to the integrated circuit (which could be 1-512 bytes), so all desired user data may be available after the first read operation. The intervening pairs may have a bit line at a voltage of the bit lines being sensed, so that unselected memory cells do not conduct during the first read cycle. At a second read cycle, the alternating bit line common voltages are reversed, and the remaining memory cells are read. As an option, bits for a user word may be stored in groups of adjacent memory cells that are greater than two and subsequently read in at least two read cycles.

While a shared bit line array embodiment has been set forth, various $4F^2$ cell implementation features will now be set forth which may differ from such embodiment. For example, in one embodiment, multiple cells that share a bit line and a word line may be written-off (i.e. discharged) at the same time. Thereafter, a selective write on operation may be performed. In such embodiment, a write off operation may be referred to as an erase operation, since a group of cells may be written-off at the same time. Of course, a user does not necessarily have to be aware of such feature. In use, a write off operation may be performed first as a group of cells, so that a $4F^2$ cell may be used for general re-writable memory operations.

Figure 8:
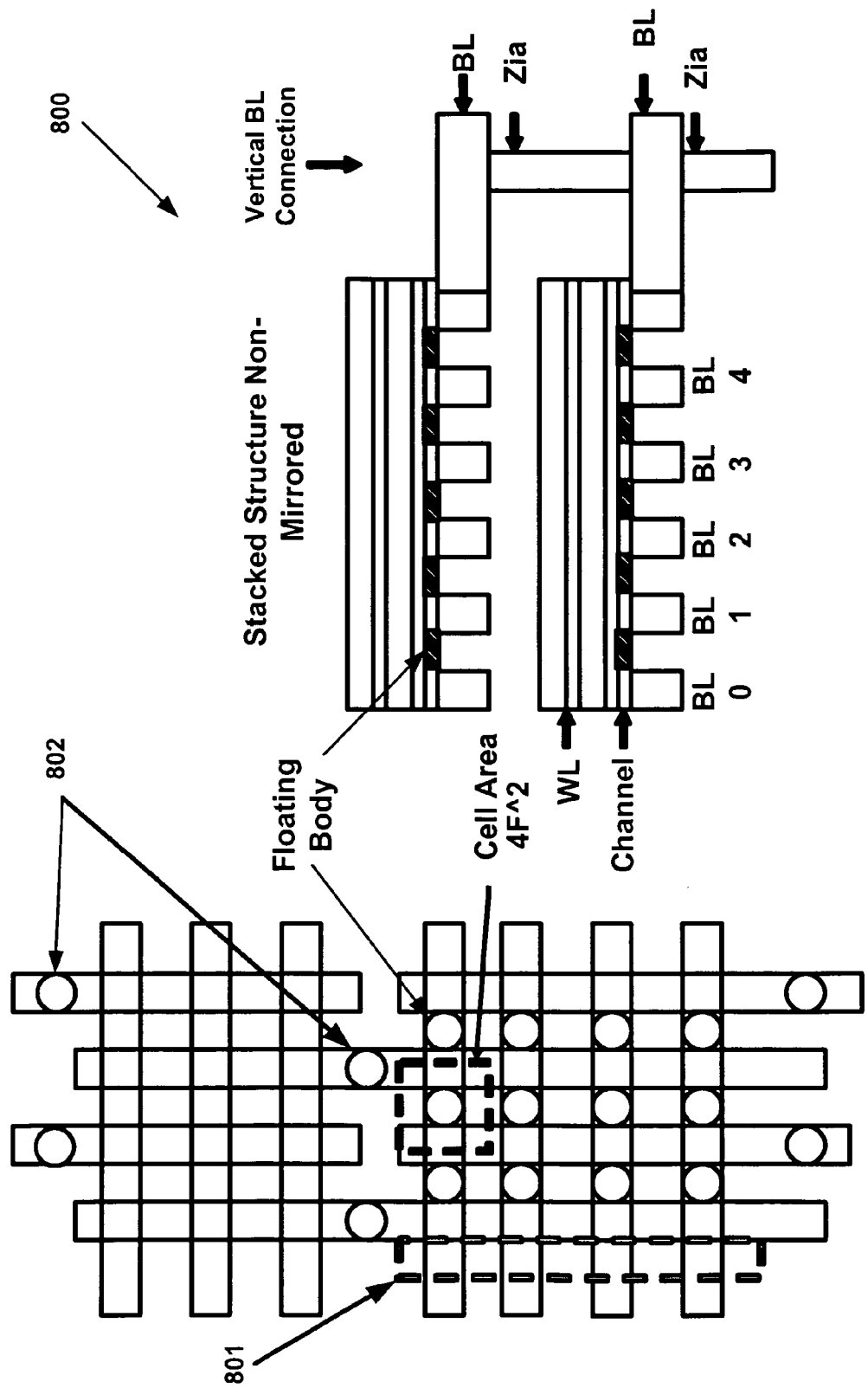
FIG. 8 illustrates a stacked, non-mirrored memory array structure, in accordance with another embodiment.

FIG. 8 illustrates a stacked, non-mirrored memory array structure 800, in accordance with another embodiment. Shown in such figure is a particular timing of the etching of a related vertical connection, termed a "zia," in the context of the present $4F^2$ layout. Such zia relates to a via-type structure connecting more than one level in the z-direction. In the present figure, a zia hole may be etched before the deposit of the bit line material, such that such bit line material may be used to fill the zia hole, in the manner shown.

As shown, a dummy bit line at an end of a word line may optionally be used to electrically cut off the channel region, which may be self-aligned to the word line and may short to the word line voltage at the zia. Note unused cells 801. As a further option, bit line contacts may be positioned every 64 to 512 cells, and zias may be interleaved, in some embodiments, thus obviating the need for positioning the zia on the same pitch as the memory cell.

Specifically, the bit line segments both above and below the zia connection share the vertical bit line connection in order to save area. Further, the bit line zia locations are staggered, as noted by numeral 802, thus providing for a relaxing of the pitch of the zia connections.

Various Three-dimensional Embodiments

Figure 9:
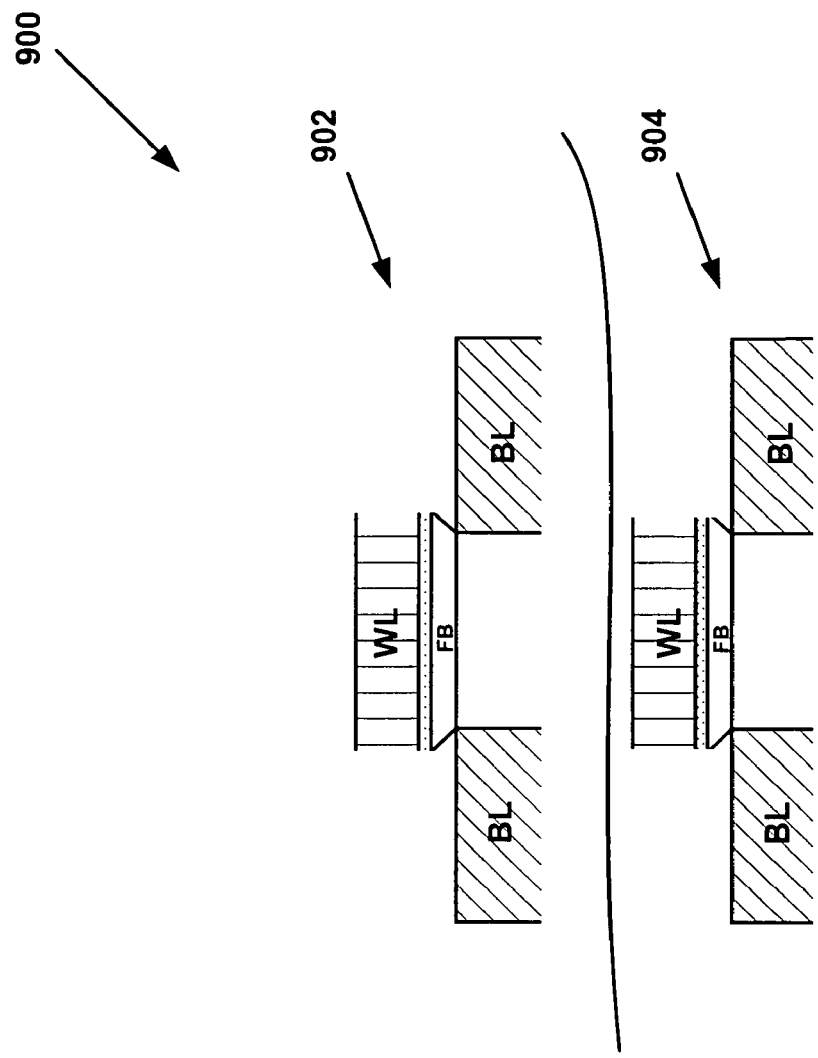
FIG. 9 illustrates one three-dimensional memory array arrangement where multiple levels of memory cells do not share lines, in accordance with one embodiment.

FIG. 9 illustrates one three-dimensional memory array arrangement 900 where multiple levels of memory cells do not share lines, in accordance with one embodiment. Specifically, as shown, the bit lines of an upper level 902 are not in communication with the word lines of a lower level 904, and visa-versa. Thus, at least one level of the word lines may be used exclusively by a single level of the three-dimensional array of memory cells. Further, at least one level of the bit lines may be used exclusively by a single level of the three-dimensional array of memory cells. To this end, additional lines are required.

Figure 10A:
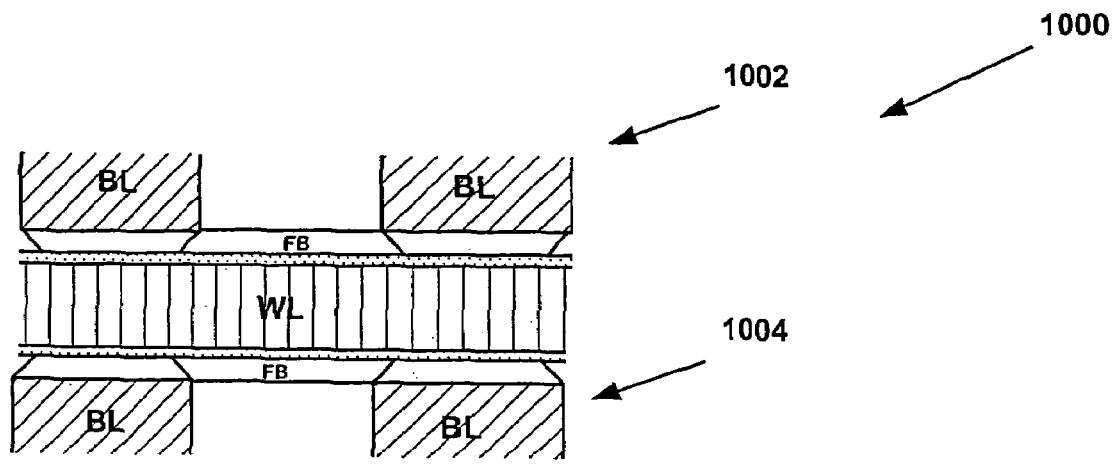
FIG. 10A illustrates another three-dimensional memory array arrangement where multiple levels of memory cells share word lines, in accordance with another embodiment.

FIG. 10A illustrates another three-dimensional memory array arrangement 1000 where multiple levels of memory cells share word lines, in accordance with another embodiment. As shown, respective word lines are shared by a plurality of levels of the three-dimensional array of memory cells. Specifically, in one embodiment, the bit lines of an upper level 1002 and a lower level 1004 are both in communication with the same word lines. To this end, fewer lines are required.

Figure 10B:
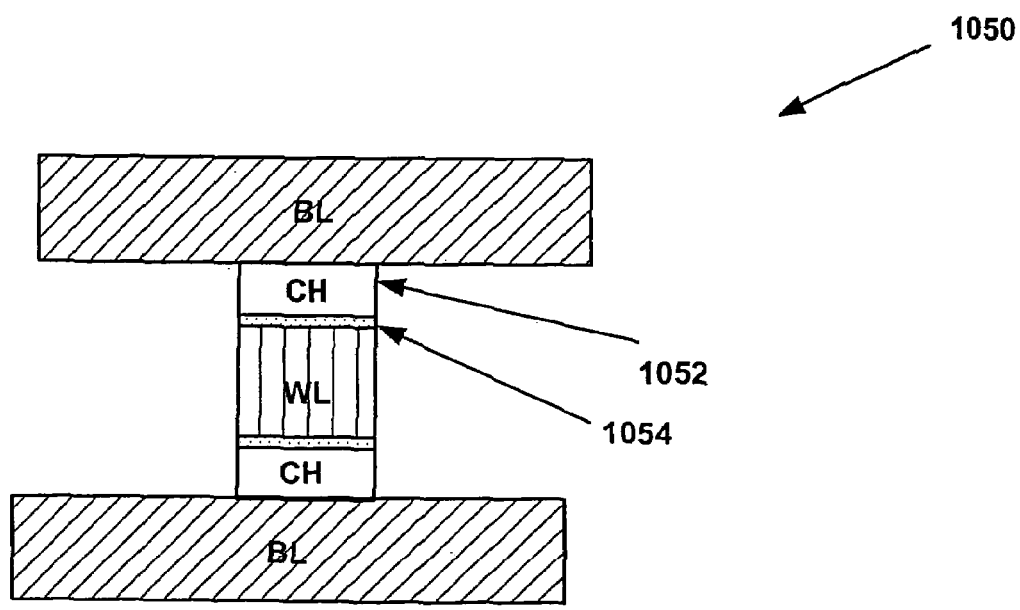
FIG. 10B illustrates yet another three-dimensional memory array arrangement where multiple levels of memory cells share word lines, in accordance with another embodiment.

FIG. 10B illustrates yet another three-dimensional memory array arrangement 1050 where multiple levels of memory cells share word lines, in accordance with another embodiment. Similar to the previous embodiment of FIG. 10A, the bit lines of an upper level and a lower level are both in communication with the same word lines. Still yet, in the present embodiment, a channel 1052 is self-aligned to sides of the word line. This may, in one embodiment, be accomplished by etching the channel 1052 and word line, as a stack. Further note should be made to the presence of a thin oxide 1054 residing between the channel 1052 and word line.

Figure 11:
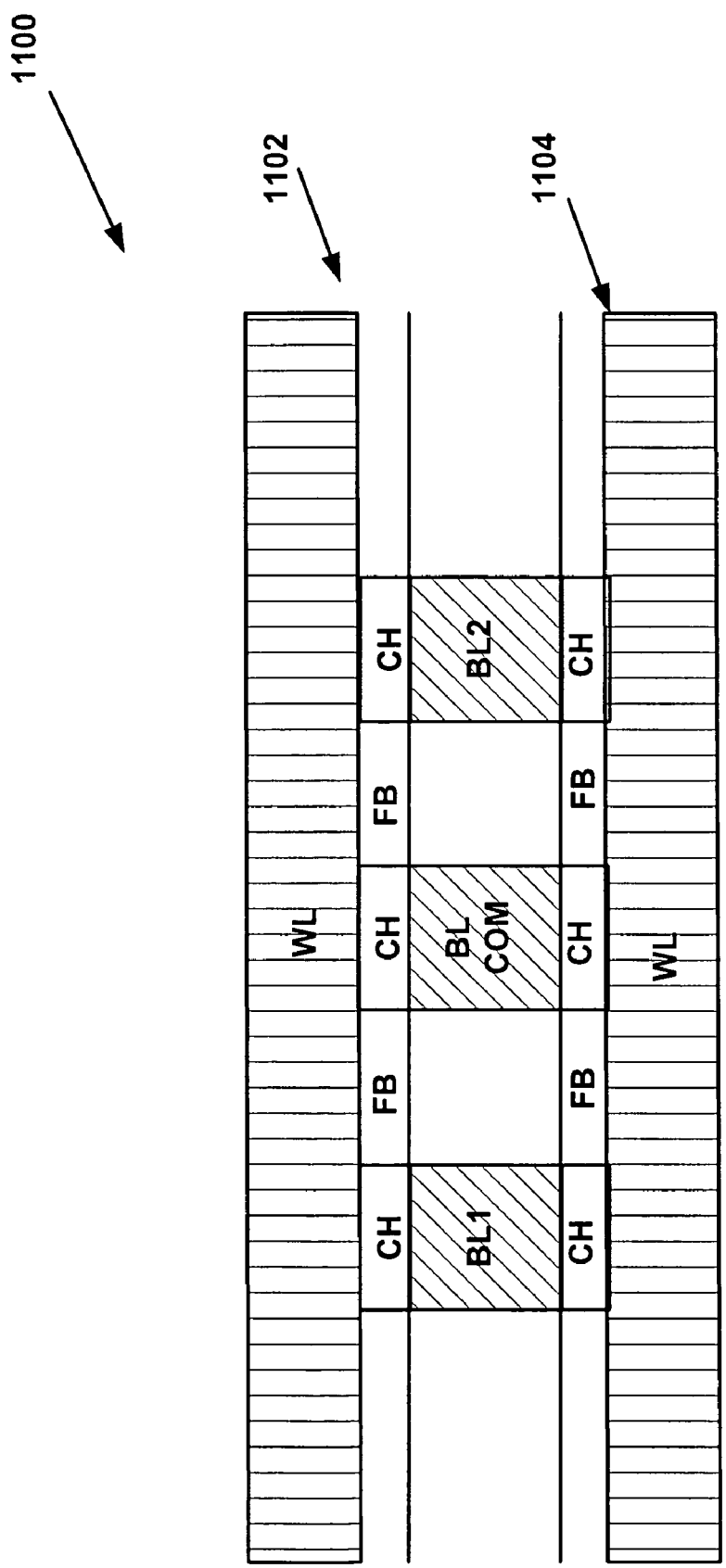
FIG. 11 illustrates another three-dimensional memory array arrangement where multiple levels of memory cells share bit lines, in accordance with still yet another embodiment.

FIG. 11 illustrates another three-dimensional memory array arrangement 1100 where multiple levels of memory cells share bit lines, in accordance with still yet another embodiment. As shown, the word lines of an upper level 1102 and a lower level 1104 are both in communication with the same bit lines. Specifically, in one embodiment, respective bit lines are shared by a plurality of levels of the three-dimensional array of memory cells. While not specifically diagrammed, it should be understood that, in yet another embodiment, both respective bit lines and word lines may be shared by a plurality of levels of the three-dimensional array of memory cells, in accordance with the teachings of FIGS. 10A, 10B, and 11.

Additional Embodiments

In some embodiments, mask data may be collected and stored in electronic form to produce an integrated circuit with any of the desired characteristics disclosed herein. Further, an integrated circuit with any of the desired characteristics disclosed herein (e.g. embodying the TFT FB memory cells) may be produced in the form of a memory integrated circuit. Further, such memory integrated circuit may be incorporated onto a memory card having a standard interface and a controller.

In still yet another embodiment, multiple types of memory arrays may be combined in a single monolithic integrated circuit. Just by way of example, DRAM or static random access memory (SRAM) may be positioned on a surface of a substrate surface (or above), and TFT floating body memory above the substrate. Still yet, a level of non-volatile or volatile rewritable or one time programmable memory cells may be positioned on or above the substrate, with TFT floating body memory above the substrate. Even still, different types of memory may be situated both on the same level above the substrate, but in different locations on the integrated circuit.

As mentioned previously, both two and three-dimensional arrays of memory cells are contemplated. In a three-dimensional array embodiment, such array of memory cells has more than one level of the word lines and/or more than one level of the bit lines. As a further option, the more than one level of bit lines and/or more than one level of word lines may be monolithically formed above a substrate in a monolithic three-dimensional memory array.

A monolithic three-dimensional memory array is one in which multiple memory levels are formed above a single substrate, such as a wafer, with no intervening substrates. The layers forming one memory level are deposited or grown directly over the layers of an existing level or levels.

In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three-dimensional memory arrays.

The foregoing description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A method for writing memory, comprising:
performing a first write operation on at least one memory cell at a first time;
performing a second write operation on at least one memory tell at a second time;
wherein each memory cell is a volatile memory cell and is included in an array of memory cells with a plurality of word lines and a plurality of bit lines, where, during use, a voltage at a corresponding word line associated with the at least one memory cell during the first write operation is different than that during the second write operation.

2. The method as recited in claim 1, wherein at least one of the first write operation and the second write operation is a write on operation, and at least one of the first write operation and the second write operation is a write off operation.

3. The method as recited in claim 2, wherein the first write operation is the write off operation, and the second write operation is the write on operation.

4. The method as recited in claim 3, wherein the voltage at the corresponding word line is higher during the write off operation than that during the write on operation.

5. The method as recited in claim 2, wherein the at least one memory cell includes a floating body in a channel region thereof, where a charge is stored on the floating body for indicating a memory cell state.

6. The method as recited in claim 5, wherein the write off operation discharges the charge utilizing a forward bias junction from the floating body to a corresponding bit line associated with the at least one memory cell.

7. The method as recited in claim 5, wherein the write on operation utilizes current flowing between a corresponding bit line and a corresponding bit line common associated with the at least one memory cell.

8. The method as recited in claim 7, wherein the write on operation utilizes a bit line voltage and a word line voltage which are each greater than a bit line common voltage.

9. The method as recited in claim 8, wherein the at least one memory cell operates in saturation and holes are injected into the floating body, during the write on operation.

10. The method as recited in claim 3, wherein the write off operation utilizes a bit line voltage which is less than a reference voltage applied during a read operation.

11. The method as recited in claim 10, wherein the reference voltage is a bit line common voltage.

12. The method as recited in claim 3, wherein the write on operation utilizes a bit line voltage which is greater than a reference voltage applied during a read operation.

13. The method as recited in claim 12, wherein the reference voltage is a bit line common voltage.

14. The method as recited in claim 1, wherein a plurality of the memory cells associated with the corresponding word line which are written during the first write operation and a plurality of the memory cells associated with the corresponding word line which are written during the second write operation are read during a single read cycle.

15. The method as recited in claim 1, wherein a first portion of a page of data is read utilizing a first read cycle, and a second portion of the page of data is read utilizing a second read cycle.

16. The method as recited in claim 3, wherein, during the write on operation, a partial write on operation is performed on at least one other memory cell.

17. The method as recited in claim 16, the partial write on operation utilizes a bit line voltage which is less than that utilized during the write on operation.

18. The method as recited in claim 1, wherein an area associated with each memory cell is less than or equal to $6F^2$, where F is a feature size.

19. The method as recited in claim 1, wherein a plurality of the bit lines associated with the at least one memory cell written at the first time are shared with at least two adjacent memory cells, where the corresponding word line associated with the at least one memory cell is shared with the at least two adjacent memory cells.

20. The method as recited in claim 3, wherein bit line voltages associated with at least one other memory cell change based on the at least one memory cell that is selected, during the write on operation.

21. The method as recited in claim 1, wherein a plurality of the memory cells are simultaneously associated with one of the plurality of bit lines and one of the plurality of word lines.

22. The method as recited in claim 2, wherein the plurality of the memory cells simultaneously associated with the one of the plurality of bit lines and the one of the plurality of word lines store a parity bit associated with data bits stored in the plurality of the memory cells.

23. The method as recited in claim 1, wherein bits of a user word are stored in spaced groups of adjacent memory cells associated with one of the word lines, each group including less than three memory cells.

24. The method as recited in claim 23, wherein the bits are read in a single read cycle.

25. The method as recited in claim 1, wherein bits of a user word are stored in groups of adjacent memory cells associated with one of the word lines, each group including more than two memory cells.

26. The method as recited in claim 25, wherein the bits are read in least two read cycles.

27. The method as recited in claim 1, wherein bits for a user word are read in alternating pairs of the memory cells associated with one of the word lines.

28. The method as recited in claim 3, wherein the first time associated with the write off operation occurs at least in part coincidently with a read operation involving a page of data stored utilizing the memory cells.

29. The method as recited in claim 1, wherein the array of memory cells is a three-dimensional array of memory cells having more than one level of the word lines and/or more than one level of the bit lines.

30. The method as recited in claim 29, wherein at least one level of the word lines is used exclusively by a single level of the three-dimensional array of memory cells.

31. The method as recited in claim 29, wherein at least one level of the bit lines is used exclusively by a single level of the three-dimensional array of memory cells.

32. The method as recited in claim 29, wherein respective word lines are shared by a plurality of levels of the three-dimensional array of memory cells.

33. The method as recited in claim 29, wherein respective bit lines are shared by a plurality of levels of the three-dimensional array of memory cells.

34. The method as recited in claim 29, wherein respective bit lines and word lines are shared by a plurality of levels of the three-dimensional array of memory cells.

35. The method as recited in claim 3, wherein the write off operation writes at least one adjacent pair of the memory cells, at the first time.

36. The method as recited in claim 35, wherein the first time occurs prior to the second time.

37. The method as recited in claim 1, wherein the at least one memory cell on which the first write operation is performed is the same as the at least one memory cell on which the second write operation is performed.

38. The method as recited in claim 1, wherein the at least one memory cell on which the first write operation is performed is different from the at least one memory cell on which the second write operation is performed.

39. A method for writing memory, comprising:
performing a write off operation on at least one memory cell by:
applying a first voltage to a corresponding bit line associated with the at least one memory cell, and
applying a second voltage to a corresponding word line associated with at least one other memory cell which is in communication with the corresponding bit line;
wherein the first voltage and the second voltage are negative voltages;
wherein each memory cell is a re-writeable memory cell and is included in an array of memory cells with a plurality of word lines and a plurality of bit lines, where, during use, a magnitude of the second voltage is greater than a magnitude of the first voltage.

40. The method as recited in claim 39, wherein the magnitude of the second voltage is twice the magnitude of the first voltage.

41. The method as recited in claim 39, wherein the magnitude of the first voltage is half a magnitude of an available voltage.

42. The method as recited in claim 39, wherein a negative voltage is applied to a corresponding bit line common associated with the at least one memory cell for preventing current from flowing through the at least one memory cell.

43. The method as recited in claim 39, wherein the at least one other memory cell includes a floating body in a channel region thereof, where a charge is stored on the floating body for indicating a memory cell state, and the second voltage couples the floating body of the at least one other memory cell to a negative voltage.

44. A method for writing memory, comprising:
performing a first write operation on at least one selected memory cell at a first time; and
performing a second write operation on at least one selected memory cell at a second time;
wherein each memory cell is a re-writeable memory cell and is included in an array of memory cells with a plurality of word lines and a plurality of bit lines, where, during use, a voltage at a corresponding word line associated with at least one unselected memory cell during the first write operation is different than that during the second write operation.

45. The method as recited in claim 44, wherein the array of memory cells is a three-dimensional array of memory cells having more than one level of the word lines and/or more than one level of the bit lines.

46. The method as recited in claim 45, wherein at least one level of the word lines is used exclusively by a single level of the three-dimensional array of memory cells.

47. The method as recited in claim 45, wherein at least one level of the bit lines is used exclusively by a single level of the three-dimensional array of memory cells.

48. The method as recited in claim 45, wherein respective word lines are shared by a plurality of levels of the three-dimensional array of memory cells.

49. The method as recited in claim 45, wherein respective bit lines are shared by a plurality of levels of the three-dimensional array of memory cells.

50. The method as recited in claim 45, wherein respective bit lines and word lines are shared by a plurality of levels of the three-dimensional array of memory cells.

51. A method for writing memory, comprising:
performing a first write operation on at least one selected memory cell at a first time; and
performing a second write operation on at least one selected memory cell at a second time;
wherein each memory cell is a volatile memory cell and is included in an array of memory cells with a plurality of word lines and a plurality of bit lines, where, during use, a voltage at a corresponding bit line common associated with at least one unselected memory cell during the first write operation is different than that during the second write operation.

52. The method as recited in claim 51, wherein the array of memory cells is a three-dimensional array of memory cells having more than one level of the word lines and/or more than one level of the bit lines.

53. The method as recited in claim 52, wherein at least one level of the word lines is used exclusively by a single level of the three-dimensional array of memory cells.

54. The method as recited in claim 52, wherein at least one level of the bit lines is used exclusively by a single level of the three-dimensional array of memory cells.

55. The method as recited in claim 52, wherein respective word lines are shared by a plurality of levels of the three-dimensional array of memory cells.

56. The method as recited in claim 52, wherein respective bit lines are shared by a plurality of levels of the three-dimensional array of memory cells.

57. The method as recited in claim 52, wherein respective bit lines and word lines are shared by a plurality of levels of the three-dimensional array of memory cells.

58. A method for writing memory, comprising:
performing a first write operation on at least one memory cell at a first time;
performing a second write operation on at least one memory cell at a second time;

wherein each memory cell is a volatile memory cell and is included in an array of memory cells with a plurality of word lines and a plurality, of bit lines, where, during use, a voltage at a corresponding word or bit line associated with the at least one memory cell during the first write operation is different than that during the second write operation.

* * * * *